United States Patent [19]

Higuchi et al.

[11] Patent Number: 5,053,646
[45] Date of Patent: Oct. 1, 1991

[54] PROGRAMMABLE LOGIC DEVICE HAVING EXPANDED LOGIC CAPABILITY

[75] Inventors: Mitsuo Higuchi, Tokyo; Kiyonori Ogura, Kawasaki; Kohji Shimbayashi, Kasugai; Yasuhiro Nakaoka, Kawasaki, all of Japan

[73] Assignees: Fujitsu Limited, Kawasaki; Fujitsu VLSI Limited, Kasugai, both of Japan

[21] Appl. No.: 672,134

[22] Filed: Mar. 19, 1991

Related U.S. Application Data

[63] Continuation of Ser. No. 355,726, May 23, 1989, abandoned.

[30] Foreign Application Priority Data

May 25, 1988 [JP] Japan .................................. 63-126014

[51] Int. Cl.$^5$ .......................................... H03K 19/177
[52] U.S. Cl. .................... 307/465; 307/468; 307/480
[58] Field of Search ............... 307/465, 243, 468–469, 307/471, 475, 272.1, 480; 364/716

[56] References Cited

U.S. PATENT DOCUMENTS

| | | | |
|---|---|---|---|
| 4,124,899 | 11/1978 | Birkner et al. | 364/716 |
| 4,422,072 | 12/1983 | Cavlan | 340/825 |
| 4,684,830 | 8/1987 | Tsui et al. | 307/465 |
| 4,758,746 | 7/1988 | Birkner et al. | 307/465 |
| 4,758,747 | 7/1988 | Young et al. | 364/716 X |
| 4,771,285 | 9/1988 | Agrawal et al. | 307/465 X |
| 4,857,773 | 8/1989 | Takata et al. | 307/468 X |
| 4,857,775 | 8/1989 | Obata et al. | 307/471 X |
| 4,942,318 | 7/1990 | Kawana | 307/465 |
| 4,983,959 | 1/1991 | Breuninger | 307/465 X |

FOREIGN PATENT DOCUMENTS

| | | |
|---|---|---|
| 0055348 | 7/1982 | European Pat. Off. |
| 8600165 | 1/1986 | European Pat. Off. |
| 0227329 | 7/1987 | European Pat. Off. |

OTHER PUBLICATIONS

Wescon 87, vol. 31, 1987, pp. 1–11, Agrawal, AMD/MMI's Spectrum of Application Specific PLDs.
Electron Design, vol. 35, No. 8, Apr., 1987, pp. 13–25, Bursky, Faster, More Complex PLDs Arrive With Better Programming Tools.
ALTERA Corp., ALTERA EPLD Handbook 1985, pp. 20–28.

Primary Examiner—David Hudspeth
Attorney, Agent, or Firm—Armstrong, Nikaido, Marmelstein, Kubovcik & Murray

[57] ABSTRACT

A programmable logic device includes: a programmable AND array; an OR array operatively connected to the AND array; a plurality of external terminals; and a plurality of cell blocks operatively connected to the AND array and OR array and provided for each of the plurality of external terminals, each receiving two output signals from the OR array and outputting a signal to a corresponding external terminal based on the two output signals. By controlling an input/output of an input signal and an internally produced signal and a feedback thereof to the AND array, it is possible to realize various logic constitutions and develop a degree of freedom of the logic design in the entire device.

17 Claims, 7 Drawing Sheets

Fig. 1

PRIOR ART

PROGRAMMABLE LOGIC DEVICE HAVING EXPANDED LOGIC CAPABILITY

This application is a continuation of application Ser. No. 355,726 filed May 23, 1980, now abandoned.

BACKGROUND OF THE INVENTION

1. Field of the Invention

The present invention relates to a programmable logic device (PLD). More particularly. it relates to a PLD including a cell block, hereinafter referred to as a macro cell, controlling a logic connection of an input/output of an input signal and an internally produced signal and a feedback thereof in accordance with contents stored in a programmable non volatile memory.

For example, in a PLD such as a programmable logic array PLA), a programmable array logic (PAL; registered trade mark) or the like. the above macro cell is provided to control a logic connection of the input/output of signals and the feedback thereof, using programmable non-volatile memory elements such as an electrically programmable read only memory (EPROM) and programmable switches controlling ON/OFF operations thereof and selecting each signal based on the contents stored in the programmable non-volatile memory elements, and thus realizes various logic constitutions.

2. Description of the Related Art

It is ideally desirable that the PLD can realize any logic circuit by a singe IC chip. Recently, the PLD products have been classified into several tens of types due to a variety of constitutions or structures. In view of this point, it is proposed that a singe chip (PLD) including several macro cells be constituted such that it can be replaced with a plurality of types of chips.

However, since a known conventional macro cell has an extremely simple constitution, it cannot realize a variety of control functions and, accordingly, it enables a replacement of only a few forms. On the other hand, to realize a LD including such a macro cell having an extremely simple constitution that can be replaced with a plurality of forms of chips, a logic designing in a programmable AND array and a programmable OR array must be carefully effected or devised. This leads to a restriction in the degree of freedom of the logic design in the entire PLD and a complication of the logic design per se, and thus is not preferable. An example of the known macro cell is disclosed in EPLD Handbook. 1985, p.20~p.28, published by ALTERA Corp., and an explanation thereof will be given later.

SUMMARY OF THE INVENTION

An object of the present invention is to provide a programmable logic device (PLD) which can provide a macro cell having a variety of functions and thus realize various logic constitutions, while expanding a degree of freedom of the logic design in the entire PLD The above object is attained by providing a programmable logic device including: a programmable AND array; an OR array operatively connected to the AND array; a plurality of external terminals; and a plurality of cell blocks operatively connected to the AND array and OR array and provided for each of the plurality of external terminals, each receiving two output signals from the OR array and outputting a signal to a corresponding external terminal based on the two output signals.

BRIEF DESCRIPTION OF THE DRAWINGS

Other objects and features of the present invention will be described hereinafter in detail by way of preferred embodiments with reference to the accompanying drawings, in which.

DESCRIPTION OF THE PREFERRED EMBODIMENTS

For a better understanding of the preferred embodiment of the present invention, the problems of the prior art will be explained with reference to FIGS. 1 and 2.

Figure 1:
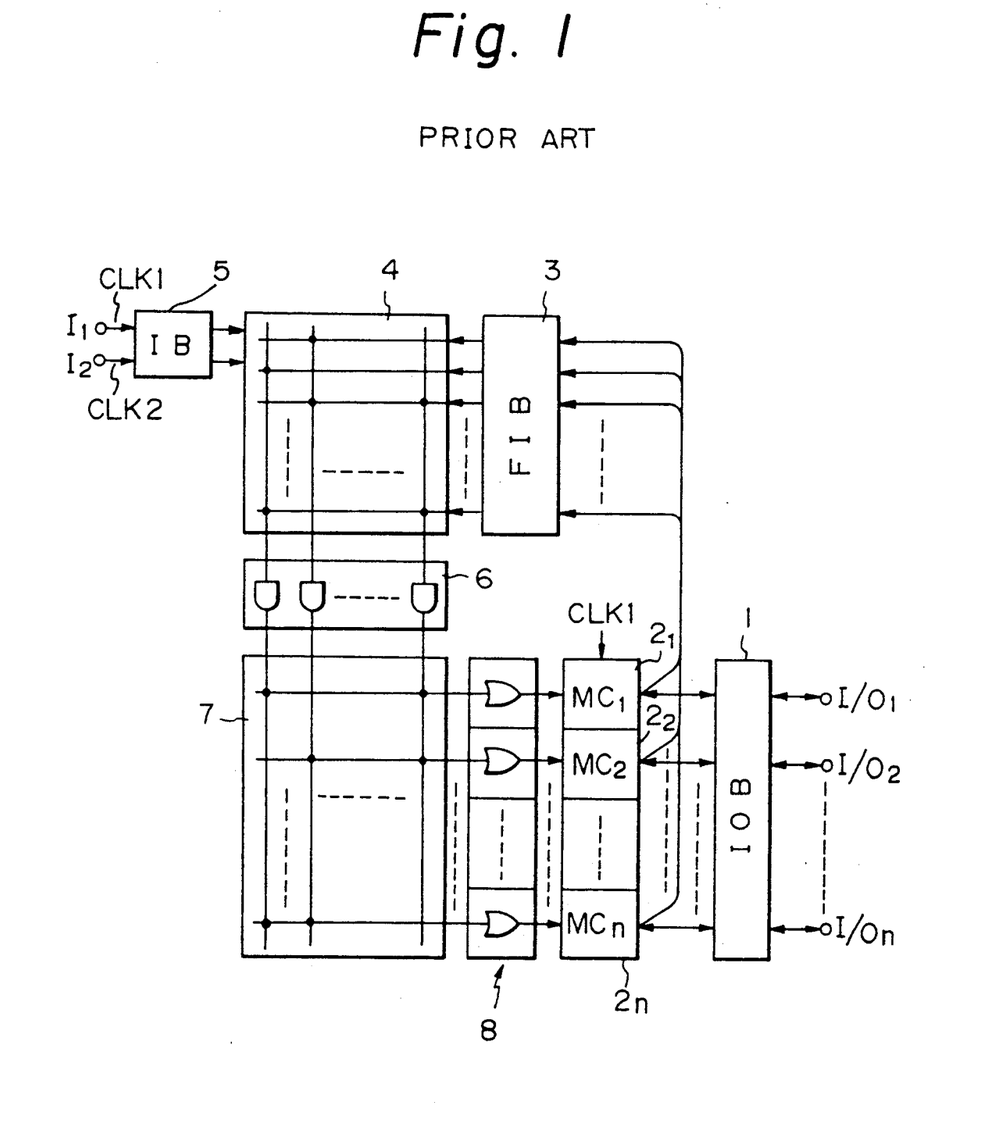
FIG. 1 is a block diagram illustrating an entire constitution of a prior art PLD.

FIG. 1 illustrates an entire constitution of a prior art PLD.

In FIG. 1. references $I/O_1 \sim I/O_n$ denote input/output (I/O) terminals; references $I_1$, $I_2$ input terminals receiving external clock signals CLK1, CLK2, respectively; reference 1 an I/O buffer (IOB); references $2_1 \sim 2_n$ macro cells ($MC_1 \sim MC_n$); reference 3 a feedback input buffer (FIB); reference 4 a programmable AND array 14; reference an input buffer (IB); reference 6 a sense amplifier (S/A) and driver circuit; reference 7 a programmable OR array; and reference 8 a sense amplifier (S/A) circuit, respectively.

According to this constitution, each of the macro cells $2_1 \sim 2_n$ is allocated for each of the output term lines in the OR array 7 on a one-to-one basis. Namely, each of the macro cells receives one output signal from the OR array 7. The output signal is employed for determining an output logic of the corresponding macro cell.

Figure 2:
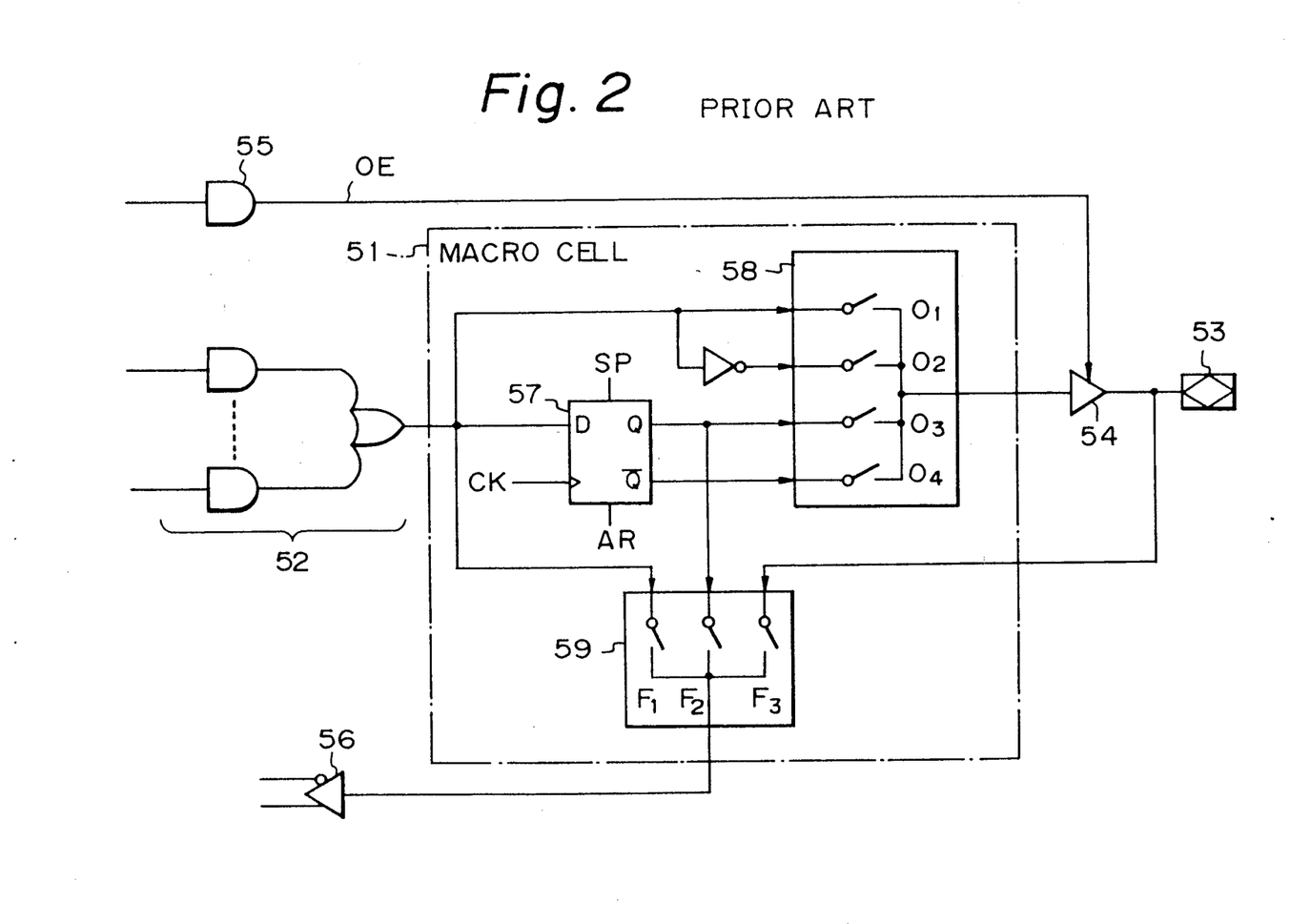
FIG. 2 is a circuit diagram schematically illustrating a constitution of a prior art macro cell.

FIG. 2 schematically illustrates a constitution of a prior art macro cell. The illustration shows the macro cell contained in the device, EP300, by ALTERA Corp.

In FIG. 2, reference 51 denotes a macro cell; reference 52 a schematic diagram of an AND array, product term lines and an OR array; reference 53 an I/O terminal of a chip; reference 54 a tristate buffer responsive to an output enable signal OE; reference 55 a gate constituting a portion of the AND array; and reference 56 a buffer used for feeding a signal back to the AND array. The macro cell 51 is mainly constituted by a D-type flip-flop 57 latching an output of the OR array, an output select circuit 58 selecting one of the outputs of the flip-flop and the output of the OR array and a feedback select circuit 59 selecting one of the outputs of the flip-flop, the output of the OR array and an external input signal.

In this constitution as well, the macro cell 51 receives one output signal from the OR array. Also, the constitution of the macro cell 51 is relatively simple. Accordingly, to realize that a PLD including the macro cell 51 that can be replaced with a variety of different PLDs, the logic design in the AND and OR arrays 52 must be carefully devised. This leads to a restriction in the degree of freedom of the logic design in the entire PLD and a complication of the logic designing per se. To prevent this drawback, for example, an approach is considered in which the number of product term lines in the AND and OR arrays 52 is increased to facilitate the logic design. According to this approach, however, another problem occurs in that the space occupied by the arrays on the chip is increased due to the increase in the number of product term lines.

Figure 3:
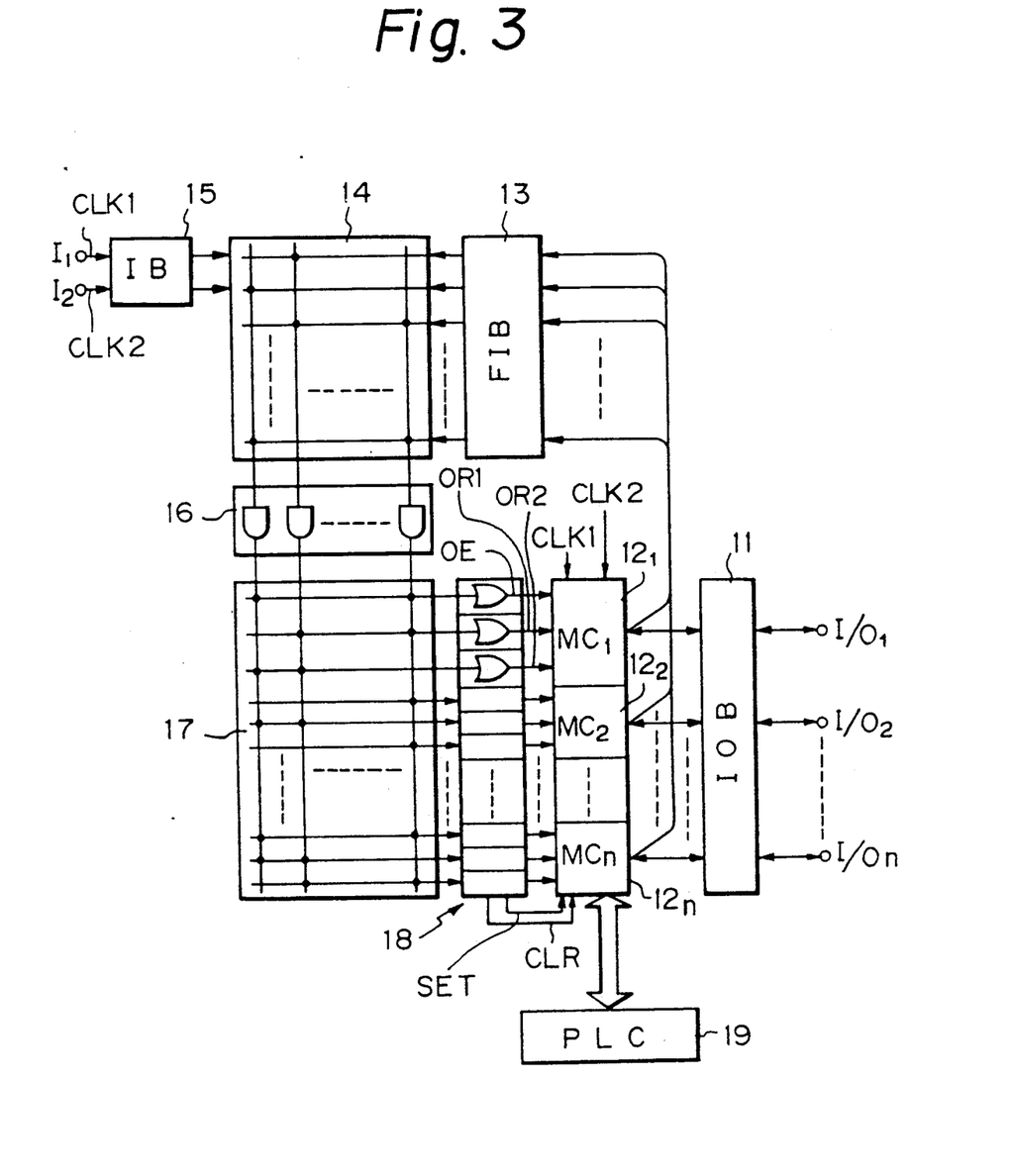
FIG. 3 is a block diagram illustrating an entire constitution of the PLD as an embodiment of the present invention.

FIG. 3 illustrates an entire constitution of the PLD as an embodiment of the present invention.

The PLD of the present embodiment is in the form of a chip having twenty four pin terminals, which consist of twenty input/output (I/O) terminals $I/O_1 \sim I/O_n$, two input terminals $I_1$, $I_2$ receiving external clock signals CLK1, CLK2, respectively, and two power supply terminals receiving voltages Vcc, Vss, (see FIG. 6), respectively.

Referring to FIG. 3, a signal input from each of the I/O terminals $I/O_1 \sim I/O_n$ is fed via an I/O buffer (IOB) 11 to a corresponding macro cell ($MC_1 \sim MC_n$) $12_1 \sim 12_n$. The macro cells $12_1 \sim 12_n$ feed the external input signals or feedback signals internally produced (stated later) via a feedback input buffer (FIB) 13 to a programmable AND array 14. Also, the clock signals CLK1, CLK2 are fed via an input buffer (IB) 15 to the AND array 14. The AND array 14 has a non-volatile memory cell such as an EPROM cell provided at each intersection between a plurality of input term lines and a plurality of product term lines. In the AND array 14, black and round marks shown at some of the intersections indicate program points. For example where a certain product term line includes three program points, a signal corresponding to a logical product of the three input signals appears on the corresponding product term line. Each output signal of the AND array 14 is fed via the corresponding product term line to a sense amplifier (S/A) and driver circuit 16, amplified and then fed to a programmable OR array 17.

The OR array 17 has the same memory cell as the AND array 14 provided at each intersection between the plurality of product term lines and a plurality of output term lines. In the same manner as in the AND array 14, black and round marks indicate program points. For example, where a certain output term ine includes two program points, a signal corresponding to a logical addition of the two input signals from the corresponding product term lines appears on the corresponding output term line. Each output signal of the OR array 17 is fed via the corresponding output term line to a sense amplifier (S/A) circuit 18 amplified and then fed to the macro cells $12_1 \sim 12_n$.

In this case. each of the macro cells $12_1 \sim 12_n$ receives three output signals OE, OR1 and OR2 from the OR array 17. The output signal OE is employed as an output enable control signal independently allocated to each macro cell, while the output signals OR1 and OR2 are employed for determining an output logic of the corresponding macro cell. The signals OR1 and OR2 are separated into a feedback signal and an output signal based on the output logic of the corresponding macro cell. The feedback signal is fed via the feedback input buffer 13 to the AND array 14 as described above, while the output signal is output via the I/O buffer 11 to the corresponding I/O terminal $I/O_1 \sim I/O_n$. Also each of the macro cells $12_1 \sim 12_n$ receives the clock signals CLK1, CLK2, and a set signal SET and a clear signal CLR from the S/A circuit 18.

Reference 19 denotes a power-on load circuit (PLC) including a matrix (not shown) in which a plurality of non-volatile memory elements such as EPROMs are arrayed. The power-on load circuit 19 has the function of reading the contents stored in the matrix when the power is turned ON and loading the read contents into registers (not shown) in each of the macro cells $12_1 \sim 12_n$.

Each of the macro cells $12_1 \sim 12_n$ has the function of controlling ON/OFF operations of a plurality of switches (not shown) and a selection of each signal based on the contents loaded into the registers and thus controlling a logic connection of the input/output of each signal and the internal feedback so as to realize various logic constitutions.

Next, a constitution of the macro cell shown in FIG. 3 will be explained with reference to FIG. 4.

Figure 4:
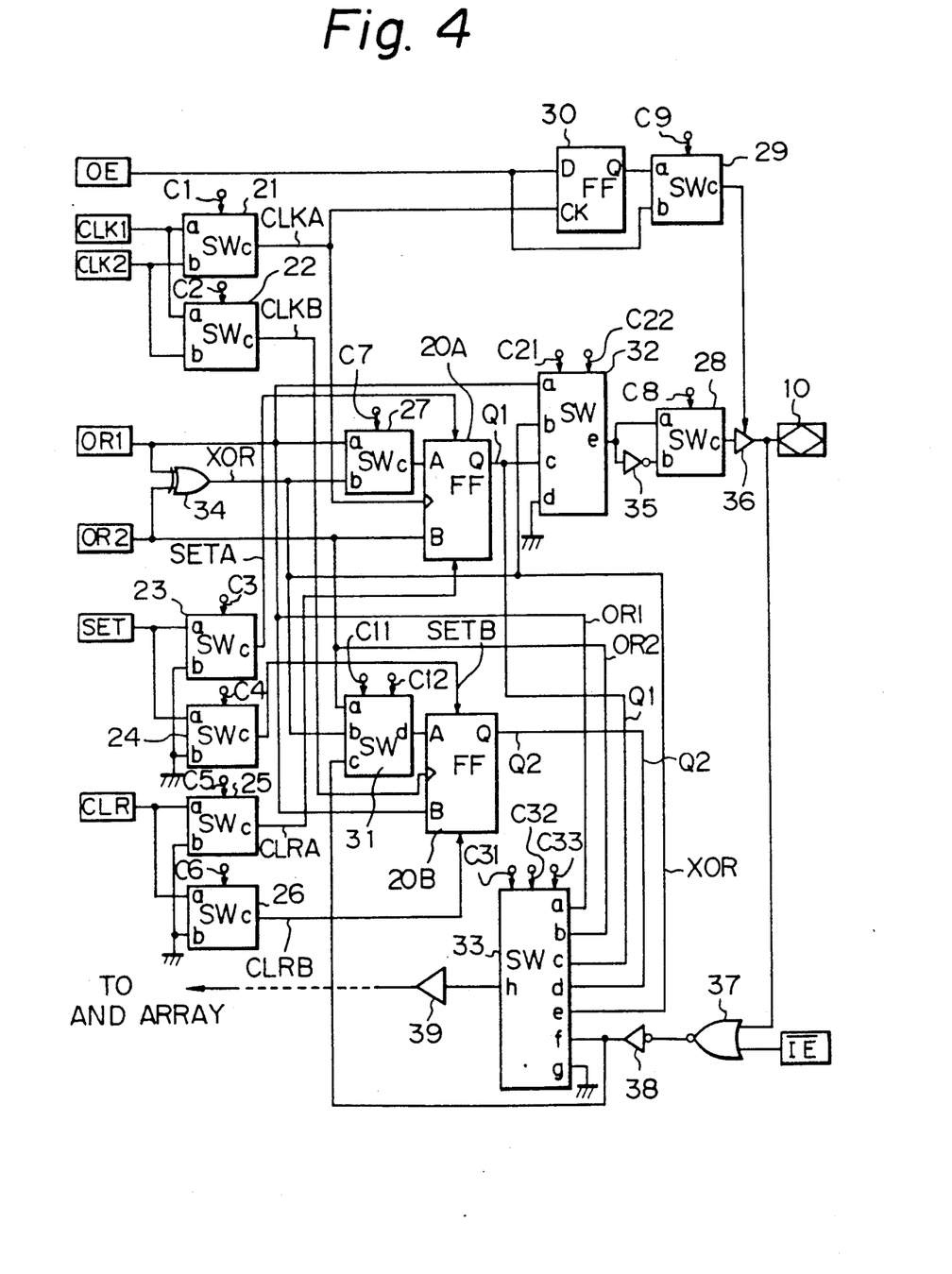
FIG. 4 is a circuit diagram illustrating a constitution of the macro cell shown in FIG. 3.

In FIG. 4, reference 10 denotes an I/O terminal corresponding to each of the terminals $I/O_1 \sim I/O_n$ shown in FIG. 3 and references 20A, 20B denote programmable flip-flop (FF) cells. The FF cell is constituted such that it can be adapted to any type of Flip-Flop such as a JK-type, a D-type or a T-type, as described later. Reference 30 denotes a D-type flip-flop, which has a function of controlling the output enable signal OE and thus switching an input cycle and an output cycle.

References $21 \sim 29$, 31, 32 and 33 denote switches (SW) which can be programmed by a user. Among these switches, each of the two-input type switches $21 \sim 29$ selects one of two signals applied to its inputs a,b in accordance with a logic level of the corresponding control signal $C1 \sim C9$ of one bit and outputs the selected signal to its output c. Also, the three-input type switch 31 selects one of three signals applied to its inputs $a \sim c$ in accordance with each logic level of the corresponding control signals C11,C12 of two bits and outputs the selected signal to its output d. Also, the four-input type switch 32 selects one of four signals applied to its inputs $a \sim d$ in accordance with each logic level of the corresponding control signals C21,C22 of two bits and outputs the selected signal to its output e. Furthermore, the seven-input type switch 33 selects one of seven signals applied to its inputs $a \sim g$ in accordance with each logic level of the corresponding control signals $C31 \sim C33$ of three bits and outputs the selected signal to its output h.

Note, the control signals applied to each switch (SW) are fed via registers (not shown) from the power-on load circuit 19.

Reference 34 denotes an exclusive-OR gate; reference 35 an inverter; reference 36 a tristate buffer; reference 37 a NOR gate; reference 38 an inversion input type buffer; and reference 39 a buffer.

In the present embodiment, each of the macro cells $12_1 \sim 12_n$ receives: two output signals OR1 and OR2 from the OR array 17; two external clock signals CLK1 and CLK2; the output enable signal OE from the OR 17; the set signal SET and the clear signal CLR from the S/A circuit 18; and an active-low input enable signal $\overline{IE}$ internally produced based on the output enable sign OE.

The output signal OR1 of the OR array 17 is fed to one input of the exclusive-OR gate 34, one input a of the switch 27, one input a of the switch 32, one input B of the FF cell 20B and one input a of the switch 33. On the other hand, the output signal OR2 is fed to another input of the exclusive-OR gate 34, one input B of the FF cell 20A, one input a of the switch 31 and one input b of the switch 33. Also, the output signal XOR of the exclusively-OR gate 34 is fed to one input b of the switch 27, one input b of the switch 31, one input b of the switch 32 and one input e of the switch 33.

Also, the clock signals CLK1,CLK2 are fed to the inputs a,b of the switch 21(22), respectively. The switch 21 outputs a clock signal CLKA from its output c, which is fed to a clock input CK of the D-type FF 30 and a cock input of the FF cell 20A. On the other hand, the switch 22 outputs a cock signal CLKB from its output c, which is fed to a clock input of the FF cell 20B.

The output enable signal OE of the OR array 17 is fed to the data input D of the D-type FF 30 and one input b of the switch 29. The output Q of the D-type FF 30 is connected to one input a of the switch 29 and the output c of the switch 29 is connected to the control input of the tristate buffer 36. Each input a of the switches 23,24 receives the set signal SET and each input b thereof is grounded. The switch 23 (24) outputs a set signal SETA (SETB) from its output c, which is fed to the FF cell 20A (20B). Also, each input a of the switches 25,26 receives the clear signal CLR and each input b thereof is grounded. The switch 25 (26) outputs a clear signal CLRA (CLRB) from its output c, which is fed to the FF cell 20A (20B).

The output c of the switch 27 is connected to another input A of the FF cell 20A and the output Q (output signal Q1) of the FF cell 20A is connected to one input c of the switch 32 and one input c of the switch 33. The output e of the switch 32 is connected to one input a of the switch 28 and connected via the inverter 35 to another input b of the switch 28. The output c of the switch 28 is connected via the tristate buffer 36 to the I/O terminal 10. On the other hand, the output d of the switch 31 is connected to another input A of the FF cell 20B and the output Q (output signal Q2) of the FF cell 20B is connected to one input d of the switch 33.

One input of the NOR gate 37 is connected to the I/O terminal 10 and another input thereof receives the input enable signal $\overline{IE}$. The output signal of the NOR gate 37 is fed via the buffer 38 to one input f of the switch 33 and one input c of the switch 31. Also, the input g of the switch 33 is grounded and the output h is connected via the buffer 39 and the feedback input buffer (not shown) to the AND array 14.

Next, a circuit constitution of the FF cell shown in FIG. 4 and various examples of the connection thereof will be explained with reference to FIGS. 5A to 5D.

Figure 5A:
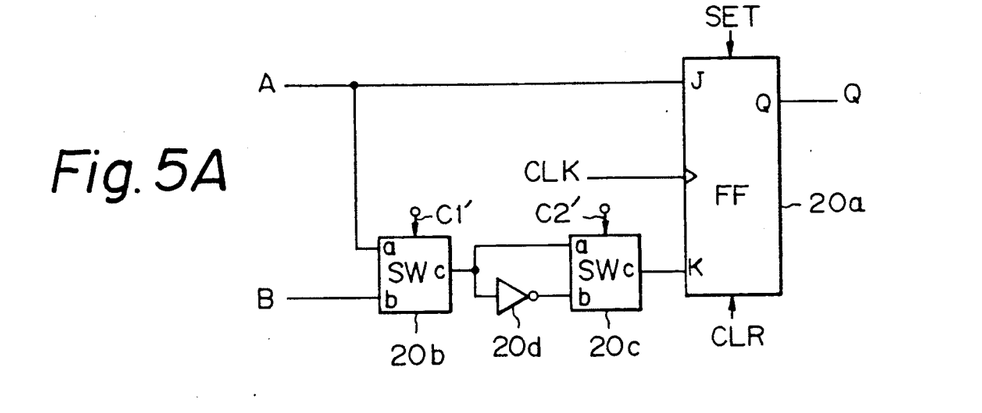
FIGS. 5A to 5D are diagrams illustrating a circuit constitution and various examples of the connection of the FF cell shown in FIG. 4.

As shown in FIG. 5A, the FF cell employed in the present embodiment is constituted by a flip-flop (FF) 20a, two two-input type switches 20b,20c and an inverter 20d. The constitution and operation of the switches 20b, 20c are the same as those of the switches 21~29 shown in FIG. 4 and thus the explanation thereof is omitted. Assuming that the switch 20b (20c) selects the input a when the control signal C1'(C2') is at "L" level and selects the input b when the control signal C1'(C2') is at "H" level, various types of FFs are constituted according to each logic level of the control signals C1',C2'.

Figure 5B:
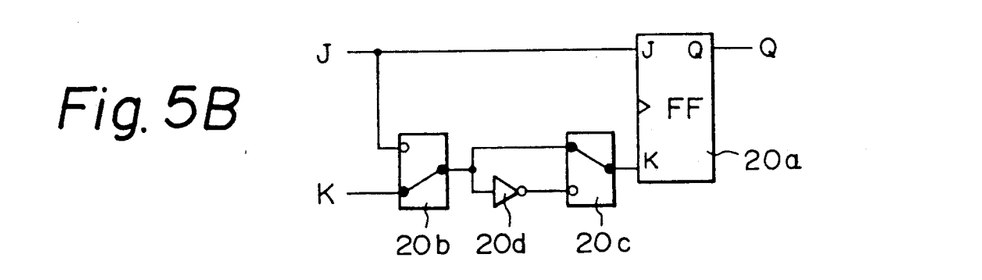
Figure 5C:
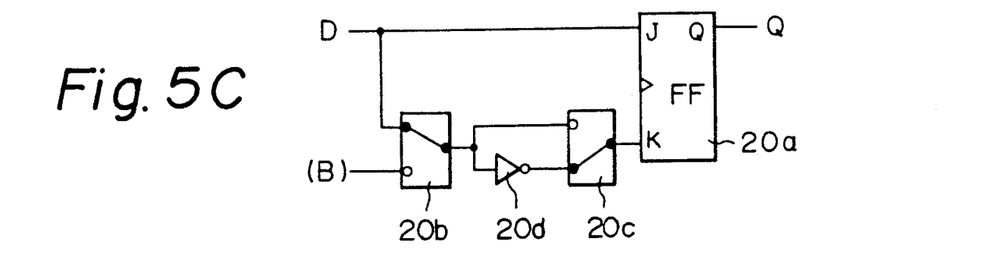
Figure 5D:
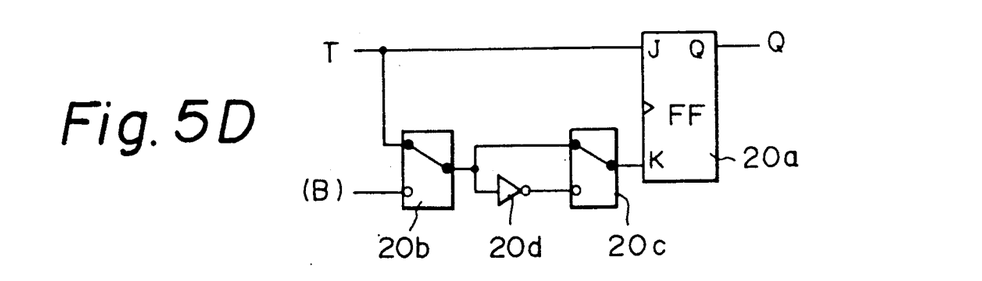

For example, when the control signal C1' is at "H" level and the control signal C2' is at "L" level switch 20b selects the input b and the switch 20c selects the input a. Accordingly, the form of the connection constitutes a JK-type FF as shown in FIG. 5B. In the same manner, when the control signal C1' is at "L" level and the control signal C2' is at "H" level, the form of connection constitutes a D-type FF as shown in FIG. 5C. Also, when the control signals C1',C2' are both at "L" level, the form of the connection constitutes a T-type FF as shown in FIG. 5D.

Next, a constitution of the two-input type switch shown in FIG. 4 will be explained with reference to FIG. 6.

Figure 6:
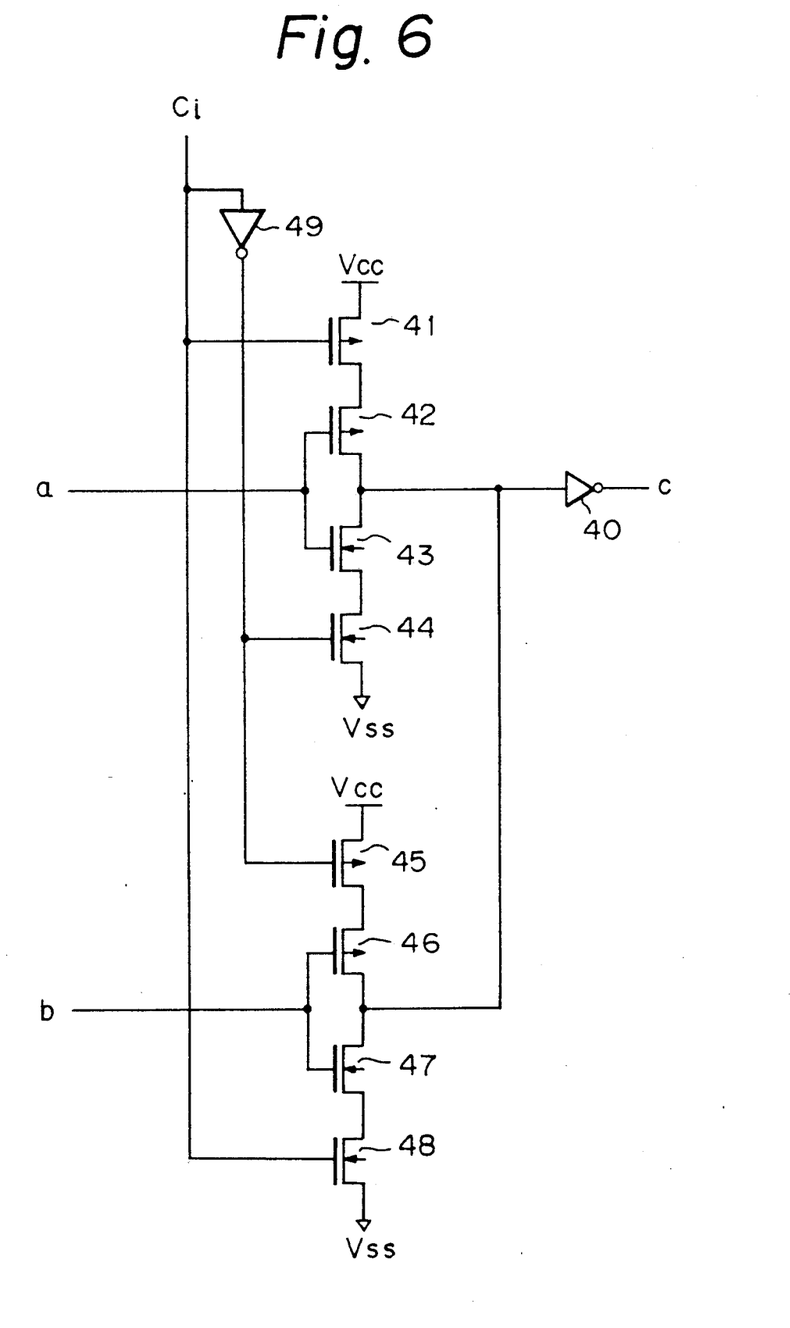
FIG. 6 is a circuit diagram illustrating a constitution of the two-input type switch shown in FIG. 4.

In FIG. 6, reference 40 denotes an inverter; references 41,42,45 and 46 p-channel transistors; references 43,44,47 and 48 n-channel transistors; reference 49 an inverter; references a and b inputs (signals); reference c an output (signal); and reference Ci a control signal of one bit. The transistors 41~44 and 45~48 are connected in series between a higher voltage power supply line Vcc and a lower voltage power supply line Vss, respectively. Each drain of the transistors 42,43 and each drain of the transistors 46,47 are commonly connected via the inverter 40 to the output c. Each gate of the transistors 42,43 is commonly connected to the input a, and each gate of the transistors 46,47 is commonly connected to the input b. Also, the control signal Ci is fed to each gate of the transistors 41,48 and fed via the inverter 49 to each gate of the transistors 44,45.

In the constitution of FIG. 6 when the control signal Ci is set to either "L" level or "H" level, one of the input signals a and b is selected to form the output signal c.

When the control signal Ci is at "L" level, the transistor 41 is brought to an ON state and the transistor 48 is brought to an OFF state. Also, since the output signal of the inverter 49 is at "H" level the transistor 44 is brought to an ON state and the transistor 45 is brought to an OFF state. In this case, since the output sides of the transistors 46,47 are brought to floating states, the input signal b becomes invalid and the input signal a becomes valid.

Accordingly, when the input signal a is at "L" level, the transistor 42 is turned ON, so that the level at the input end of the inverter 40 is raised to "H" level. As a result, the level of the output signal c is lowered to "L" level. Inversely, when the input signal a is at "H" level, the transistor 43 is turned ON, so that the level of the output signal c is raised to "H" level.

On the other hand, when the control signal Ci is at "H" level, the ON/OFF operation of each transistor is carried out inversely to the case when the control signal Ci is at "L" level. Namely. the input signal a becomes invalid and the input signal b becomes valid. Accordingly, when the input signal b is at "L" level, the transistor 46 is turned ON, so that the level of the output signal c is lowered to "L" level. Inversely, when the input signal b is at "H" level, the transistor 47 is turned ON, so that the level of the output signal c is raised to "H" level.

According to the constitution of the macro cell employed in the present embodiment, the FF cell 20A mainly, used for the output of signals and the FF cell 20B used for the feedback thereof are separately provided and the selection of the input mode or the output mode of signals is effected by the associated operation of the D-type FF 30, switch 29, tristate buffer 36 and NOR gate 37. As a result, it is possible to independently control the input of the input signal, the output of the internally produced signal and the feedback thereof to the AND array.

Also, since the FF cells 20A,20B can be modified to any type of JK-type, D-type or T-type Flip-Flop in accordance with use, it is possible to remarkably develop the function of the entire macro cell, as compared with the prior art macro cell.

Also, since each macro cell receives two output signals OR1,OR2 from the OR array 17 and the output of the exclusive-OR gate 34 responsive to the output signals OR1,OR2 can be utilized when necessary, it is possible to expand a degree of freedom of the logic design without increasing the number of product term lines.

Furthermore, since two clock signals CLKA,CLKB are provided, it is convenient when the latching of the input signal and that of the output signal are carried out simultaneously or in different phases.

Also, whether or not the set signals SETA,SETB and the clear signals CLRA,CLRB are fed to the FF cells 20A,20B, respectively, can be freely selected by suitably controlling the switches 23~26.

Figure 7:
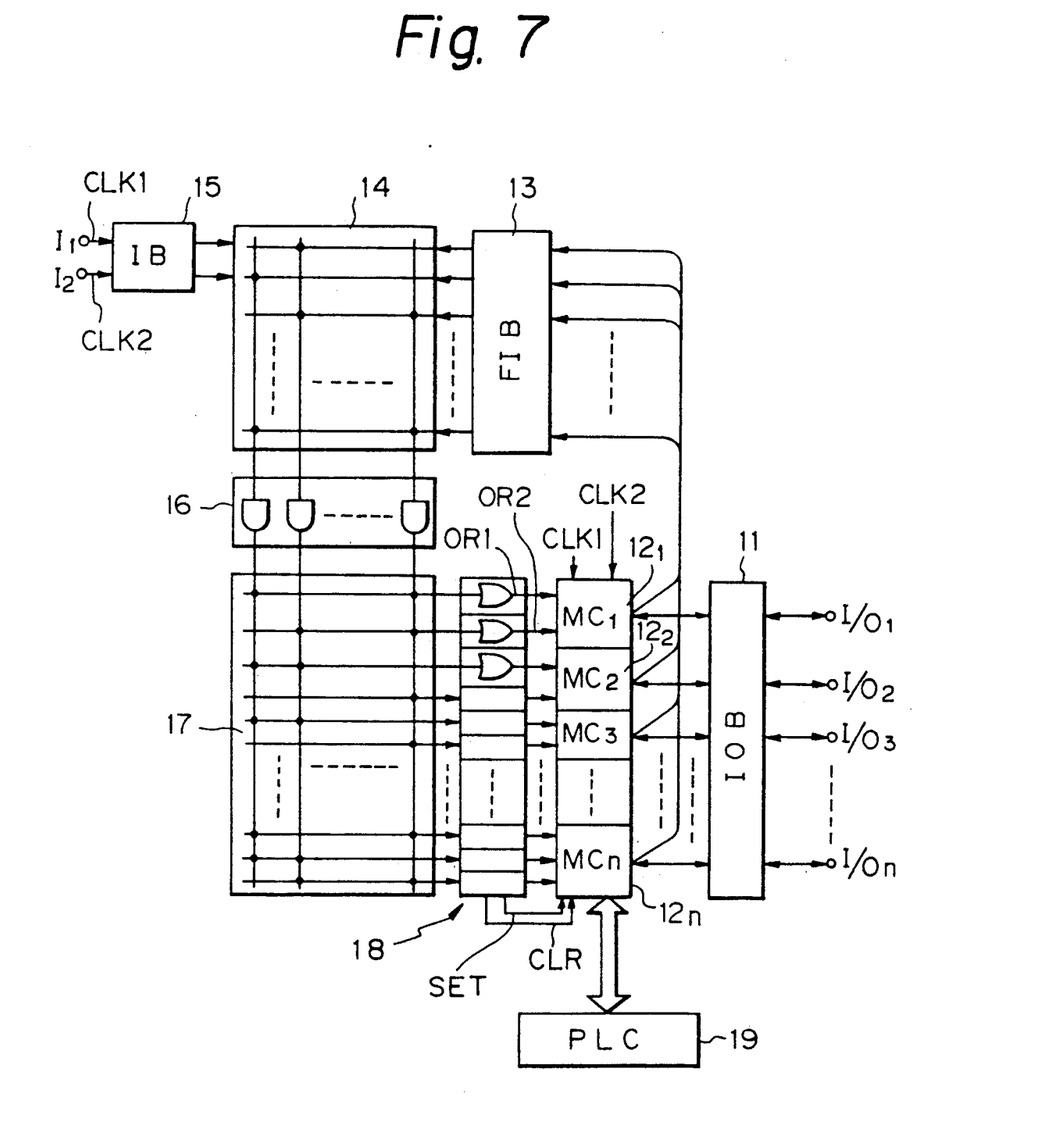
FIG. 7 is a block diagram illustrating an entire constitution of the PLD as another embodiment of the present invention.

Although the OR array 17 is a programmable one in the above-described embodiment, it is not restrictive. For example, a fixed wiring type OR array may be used instead. Also, although each of the macro cells receives the output enable control signal OE from the OR array 17 in the embodiment of FIG. 3, the signal OE need not be output from the OR array. FIG. 7 shows an example of the constitution in which each macro cell does not receive the signal OE.

Although the present invention has been disclosed and described by way of one embodiment, it is apparent to those skilled in the art that other embodiments and modifications of the present invention are possible without departing from the spirit or essential features thereof.

We claim:

1. A programmable logic device comprising:
   a programmable AND array;
   a plurality of external terminals;
   an OR array operatively connected to said AND array and divided into a number of blocks corresponding to the number of said external terminals; and
   a cell block provided, respectively, for each of the plurality of external terminals, each cell block being operatively connected to the OR array, each cell block including a logical gate for receiving at least two output signals from a corresponding block of the OR array independently of other cell blocks, and selecting means for selecting an output signal from the group consisting of one of said at least two output signals and an output of the logical gate and outputting the selected signal to a corresponding external terminal.

2. A device as set forth in claim 1, wherein each of said cell blocks further receives an output enable control signal from said OR array and including:
   a programmable register circuit responsive to first and second clock signals, latching two output signals fed from said OR array and an input signal fed from an external terminal of said device;
   a switch circuit having a plurality of programmable switches operatively connected to said programmable register circuit, switching for connections of said switches in accordance with the contents stored in a programmable non-volatile memory means and determining the status of said programmable register circuit; and
   an input/output control circuit responsive to said output enable control signal from said OR array, switching for an output of a signal internally produced based on the switching of said switch circuit and an input of said input signal from the external terminal, whereby the input/output of said input signal and said internally produced signal and a feedback thereof to said AND array are controlled to attain a desired logic constitution.

3. A device as set forth in claim 2, further comprising an exclusive-OR gate responsive to two output signals fed from said OR array, wherein an output signal of said exclusive-OR gate is latched in said programmable register circuit based on the switching of said switch circuit, and fed back to said AND array or output externally according to said desired logic constitution.

4. A device as set forth in claim 3, wherein said programmable register circuit comprises a first programmable flip-flop circuit latching one of two output signals fed from said OR array or the output signal of said exclusive-OR gate in response to said first clock signal and a second programmable flip-flop circuit latching another of two output signals fed from said OR array, the output signal of said exclusive-OR gate or the input signal fed from the external in response to said second clock signal.

5. A device as set forth in claim 4, wherein each of said first and second programmable flip-flop circuits comprises a JK-type flip-flop and a plurality of programmable switches operatively connected to said JK-type flip-flop, and switches connections of said switches in accordance with the contents stored in said programmable non-volatile memory means to constitute one of a JK-type flip-flop, a D-type flip-flop and a T-type flip-flop.

6. A device as set forth in claim 4, wherein said input/output control circuit comprises a D-type flip-flop latching the output enable control signal fed from said OR array in response to said first clock signal and selects the output signal of said D-type flip-flop or said output enable control signal to control the input/output of said input signal and said internally produced signal.

7. A device as set forth in claim 6, wherein the contents stored in said programmable non-volatile memory means constitute a plurality of control signals for switching connections of said plurality of programmable switches.

8. A device as set forth in claim 7, wherein said switch circuit includes a programmable switch selecting one of two output signals fed from said OR array or the output signal of said exclusive-OR gate in response to a control signal and feeding the selected signal to said first flip-flop circuit, and a programmable switch selecting another of two output signals fed from said OR array, the output signal of said exclusive-OR gate or the input signal fed in externally in response to another control signal and feeding the selected signal to said second flip-flop circuit.

9. A device as set forth in claim 7, wherein said switch circuit includes a first programmable switch selecting one of two output signals fed from said OR array, the output signal of said exclusive-OR gate or the output signal of said first flip-flop circuit in response to a control signal, and a second programmable switch selecting the signal selected by said first programmable switch or the inverted signal in response to another control signal and outputting the selected signal to said input/output control circuit.

10. A device as set forth in claim 7, wherein said switch circuit includes a programmable switch responsive to a control signal, selecting one of two output signals fed from said OR array, the output signals of said first and second flip-flop circuits, the output signal of said exclusive-OR gate and the input signal fed from the external.

11. A device as set forth in claim 7, wherein said switch circuit includes a pair of programmable switches, each selecting one of two different external clock signals in response to a control signal, a pair of clock signals selected by said pair of programmable switches being used as said first and second clock signals.

12. A device as set forth in claim 7, wherein said switch circuit includes a pair of programmable switches, each selecting a feeding or a prohibition of said feeding of a set signal for bringing the corresponding programmable flip-flop circuit to the set state in response to a control signal.

13. A device as set forth in claim 7, wherein said switch circuit includes a pair of programmable switches, each selecting a feeding or a prohibition of said feeding of a clear signal for bringing the corresponding programmable flip-flop circuit to the reset state in response to a control signal.

14. A programmable logic device comprising:
a programmable AND array;
an OR array operatively connected to said AND array;
a plurality of external terminals; and
a cell block provided, respectively, for each of the plurality of external terminals, each cell block being operatively connected to the AND array and the OR array, each cell block receiving two output signals from the OR array and outputting a signal to a corresponding external terminal based on the two output signals, wherein each of said plurality of cell blocks further receives an output enable control signal from said OR array, said cell blocks each including:
a programmable register circuit, responsive to first and second clock signals, for latching said two output signals fed from said OR array and an input signal fed from an external terminal of said device;
a switch circuit, having a plurality of programmable switches operatively connected to said programmable register circuit, for switching connections of said switches in accordance with the contents stored in a programmable non-volatile memory means and determining the status of said programmable register circuit, and
an input/output control circuit, responsive to said output enable control signal from said OR array, for switching an output of a signal internally produced based on the switching of said switch circuit and an input of said input signal from the external terminal, wherein the input/output of said input signal and said internally produced signal and a feedback thereof to said AND array are controlled to attain a desired logic constitution.

15. A programmable logic device comprising:
a programmable AND array;
a plurality of external terminals;
an OR array operatively connected to said AND array and divided into a number of blocks corresponding to the number of said external terminals; and
a cell block provided, respectively, for each of the plurality of external terminals, each cell block being operatively connected to the OR array, each cell block including a JK-type flip-flop having a first input end for receiving one of two output signals from a corresponding block of the OR array, a first programmable switch for selecting one of the two output signals, and a second programmable switch for selecting either an output of the first programmable switch or an inverted output thereof and outputting the selected signal to a second input end of the JK-type flip-flop.

16. A programmable logic device comprising:
a programmable AND array;
a plurality of external terminals;
an OR array operatively connected to said AND array and divided into a number of blocks corresponding to the number of said external terminals; and
a plurality of macro cells provided between the OR array and the plurality of external terminals, each macro-cell including a first register for retaining output signals from a corresponding block of the OR array, a second register for retaining an input signal from a corresponding external terminal, a first programmable switch for selecting one of first and second clocks and feeding the selected clock to the first register, and a second programmable switch for selecting one of the first and second clocks and feeding the selected clock to the second register.

17. A programmable logic device comprising:
a programmable AND array;
a plurality of external terminals;
an OR array operatively connected to said AND array and divided into a number of blocks corresponding to the number of said external terminals; and
a plurality of macro cells provided between the OR array and the plurality of external terminals, each macro cell including a register for retaining output signals from a corresponding block of the OR array, a first programmable switch for selecting either a set signal or a fixed logic level signal and feeding the selecting signal to the register, and a second programmable switch for selecting either a clear signal or the fixed logic level signal and feeding the selected signal to the register.

* * * * *